United States Patent
Meguro et al.

(10) Patent No.: US 10,470,326 B2
(45) Date of Patent: Nov. 5, 2019

(54) WATERTIGHT CAP AND ELECTRONIC APPARATUS

(71) Applicant: CASIO COMPUTER CO., LTD., Shibuya-ku, Tokyo (JP)

(72) Inventors: Hiromasu Meguro, Sagamihara (JP); Yasunori Chiba, Tachikawa (JP); Shinya Okumura, Higashiyamato (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 158 days.

(21) Appl. No.: 15/643,968

(22) Filed: Jul. 7, 2017

(65) Prior Publication Data

US 2018/0084660 A1 Mar. 22, 2018

(30) Foreign Application Priority Data

Sep. 21, 2016 (JP) .................. 2016-184778

(51) Int. Cl.
*E05C 21/02* (2006.01)
*H05K 5/06* (2006.01)
(Continued)

(52) U.S. Cl.
CPC .............. *H05K 5/069* (2013.01); *G06F 1/16* (2013.01); *H04B 1/3888* (2013.01); *H04M 1/18* (2013.01);
(Continued)

(58) Field of Classification Search
CPC .... H04M 1/18; H04M 1/0274; H04M 1/0249; H05K 5/0217; H05K 5/0013;
(Continued)

(56) References Cited

U.S. PATENT DOCUMENTS 9,084,352 B2 * 7/2015 Shinmura ............... H04M 1/18
9,155,368 B2 * 10/2015 Chang .................... A45C 11/22
(Continued)

FOREIGN PATENT DOCUMENTS

CN 102413656 A 4/2012
JP 11260460 A 9/1999
(Continued)

OTHER PUBLICATIONS

Japanese Office Action dated Jul. 5, 2019 (and English translation thereof) issued in counterpart Japanese Application No. 2016-184778.
(Continued)

*Primary Examiner* — Chi Q Nguyen
(74) *Attorney, Agent, or Firm* — Holtz, Holtz & Volek PC

(57) ABSTRACT

A watertight cap used with an electronic apparatus is provided with a cap body to be set in an installing recess of the apparatus case of the electronic apparatus, an insertion part provided on the cap body and inserted into a through hole formed in the installing recess, a watertight projection provided on the peripheral surface of the insertion part to be resiliently pressed against the surface defining the through hole, a reinforce member embedded in the cap body and the insertion part for preventing the insertion part from deforming inwards, and a hook part provided on the insertion part so as to project into the apparatus case to engage with the stopping part in the through hole, when the insertion part is inserted in the through hole, thereby securing enhanced watertight of the apparatus case and preventing the cap body from slipping out from the apparatus case accidentally.

9 Claims, 6 Drawing Sheets

(51) Int. Cl.
  *H04B 1/3888*  (2015.01)
  *H05K 5/00*   (2006.01)
  *H05K 5/02*   (2006.01)
  *G06F 1/16*   (2006.01)
  *H04M 1/18*   (2006.01)
  *H04B 1/38*   (2015.01)
  *H04M 1/02*   (2006.01)

(52) U.S. Cl.
  CPC ......... *H05K 5/0013* (2013.01); *H05K 5/0217* (2013.01); *H04B 2001/3894* (2013.01); *H04M 1/0274* (2013.01)

(58) Field of Classification Search
  CPC .... H05K 5/069; H05K 5/0004; H05K 5/0239; H05K 5/03; H04B 2001/3891; H01R 13/5202; H01R 13/521
  USPC .... 49/465, 463, 464, 466, 475.1; 455/575.1; 361/600, 601, 679.01, 679.4, 437
  See application file for complete search history.

(56) References Cited

U.S. PATENT DOCUMENTS

| | | | | |
|---|---|---|---|---|
| 9,459,663 B2* | 10/2016 | Wang | .................... | G06F 1/1658 |
| 10,185,357 B2* | 1/2019 | Kanbayashi | .......... | G06F 1/1656 |
| 2010/0011671 A1* | 1/2010 | Gentemann | .............. | B60J 10/75 49/489.1 |
| 2010/0231106 A1* | 9/2010 | Okita | .................... | H05K 5/0217 312/312 |
| 2013/0126533 A1* | 5/2013 | Klosky | .................. | B65D 25/00 220/560 |
| 2014/0080334 A1* | 3/2014 | Tetsuya | .............. | H01R 13/5213 439/136 |
| 2014/0331562 A1* | 11/2014 | Shinmura | ............... | H04M 1/18 49/463 |
| 2015/0202949 A1* | 7/2015 | Ogino | .................... | B60J 5/0418 49/465 |
| 2017/0234059 A1* | 8/2017 | Chancerel | ............... | E06B 5/025 49/466 |

FOREIGN PATENT DOCUMENTS

| | | |
|---|---|---|
| JP | 2013150355 A | 8/2013 |
| WO | 2013084992 A1 | 6/2013 |

OTHER PUBLICATIONS

Chinese Office Action (and English language translation thereof) dated Jul. 8, 2019 issued in counterpart Chinese Application No. 201710567199.

* cited by examiner

WATERTIGHT CAP AND ELECTRONIC APPARATUS

CROSS-REFERENCE TO RELATED APPLICATION

The present application is based upon and claims the benefit of priority from the prior Japanese Patent Application No. 2016-184778, filed Sep. 21, 2016, the entire contents of which are incorporated herein by reference.

BACKGROUND OF THE INVENTION

1. Field of the Invention

The present invention relates to a watertight cap used for electronic apparatuses such as a mobile terminal and a cellular phone, and to an electronic apparatus provided with the watertight cap.

2. Description of the Related Art

A watertight cap used in an electronic device is disclosed in Japanese Unexamined Patent Publication No. Hei 11-260460. The cap body of the watertight cap having elastic force like gum is provided with a stationary portion. The stationary portion of the cap body is inserted and fixed in a fixing hole formed in a device case of the electronic device, and an installing part provided on the cap body is received in an insertion hole of the device case, whereby the insertion hole of the device case is closed and/or open.

The watertight cap has the installing part of the cap body, which part is formed in the shape of a pillar substantially the same as the insertion hole of the device case. Further, the pillar-shape installing part has a deformation hole formed at its center along the axis of the pillar. In the watertight cap, when the installing part of the cap body is inserted in the insertion hole of the device case, the deformation hole formed in the center of the installing part allows the installing part to deform elastically, thereby urging the external peripheral surface of the installing part to resiliently contact with a surface defining the insertion hole of the device case to realize watertight of the insertion hole.

However, since the watertight of the watertight cap for the electronic device depends on a surface contact between the external peripheral surface of the installing part of the cap body and the surface defining the insertion hole of the device case, the installing part of the cap body is required to elastically deform uniformly. If the installing part of the cap body is not deformed uniformly, a clearance gap can be produced between the external peripheral surface of the installing part of the cap body and the surface defining the insertion hole of the device case, and then the watertight will be lost between them. Further, another problem will be caused that the installing part of the cap body can be easily slipping off form the insertion hole of the device case.

SUMMARY OF THE INVENTION

According to one aspect of the invention, there is provided a watertight cap to be received by a case, which comprises a cap body which is disposed removably in an installing recess formed in the case, an insertion part having elastic force provided on the cap body, which is inserted in a through hole, when the cap body is received in the installing recess of the case, the through hole being formed in the installing recess, penetrating from inside to outside of the case, a watertight projection provided on a whole external peripheral surface of the insertion part, which watertight projection is pressed against a surface defining the through hole in the case, when the insertion part is inserted in the through hole, a reinforce member embedded in the cap body and the insertion part so as to prevent the insertion part from deforming inwards, and a hook part provided on the insertion part, which hook part protrudes inside the case to engage with an edge of the surface defining the through hole, when insertion part is inserted in the through hole of the case.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention for better understanding of the invention.

DETAILED DESCRIPTION OF THE PREFERRED EMBODIMENTS

Now, one of embodiments of the invention, which is applied to a mobile terminal, will be described with reference to accompanying drawings in detail.

Figure 1:
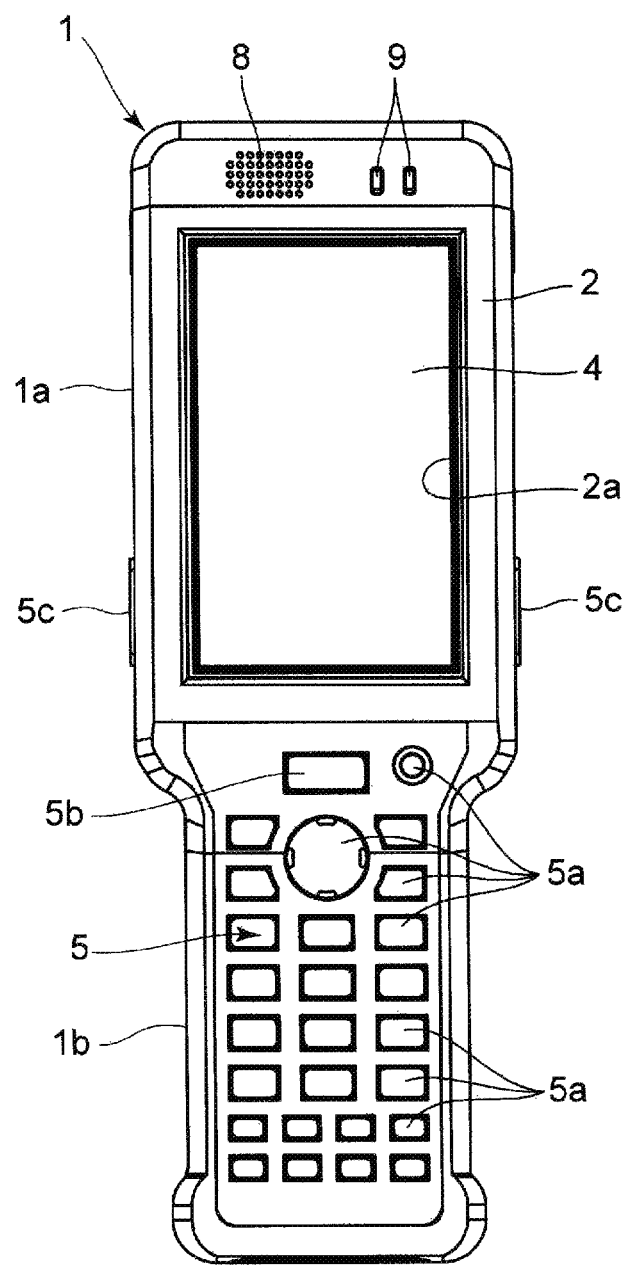
FIG. 1 is a front view showing a mobile terminal to which one embodiment of the invention is applied.
Figure 2:
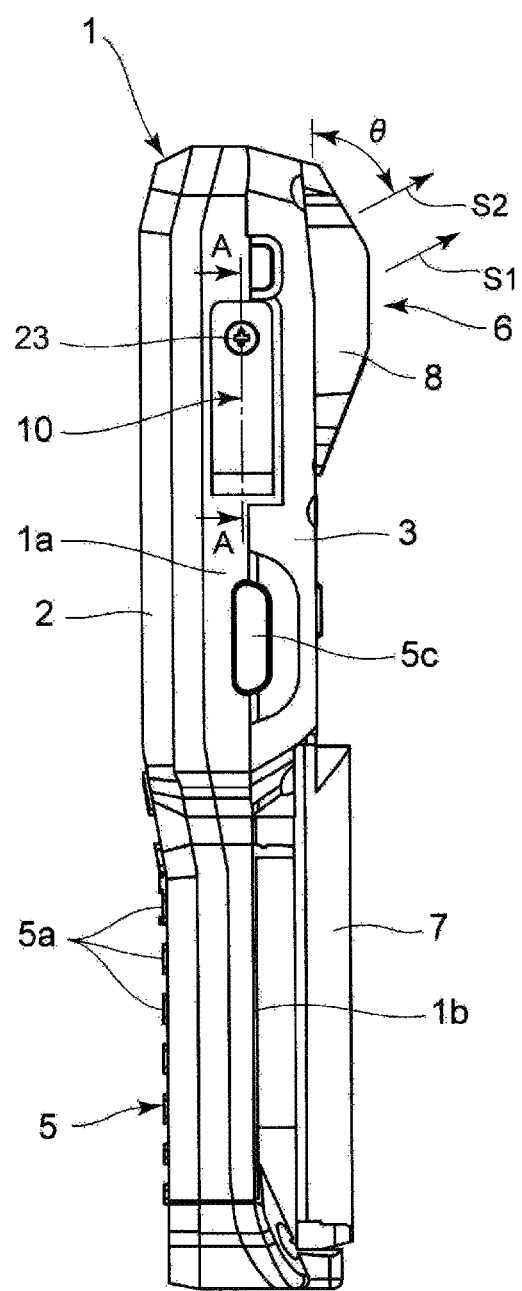
FIG. 2 is a side view showing the mobile terminal shown in FIG. 1.
Figure 3:
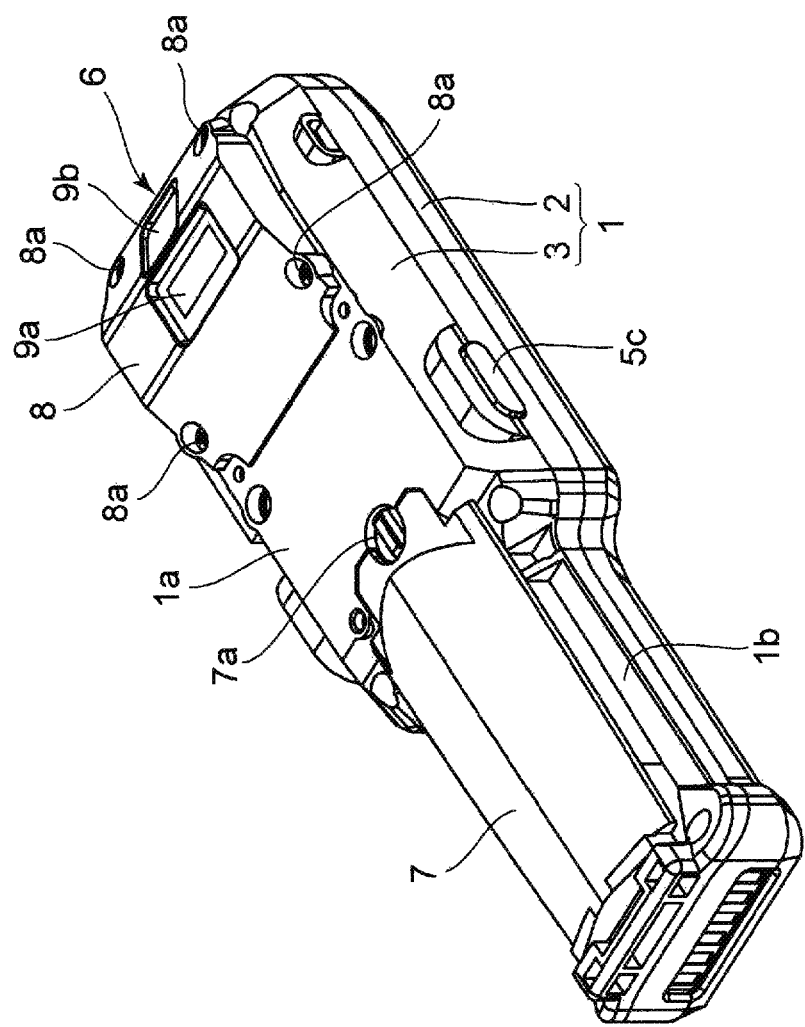
FIG. 3 is a perspective view showing the mobile terminal of FIG. 1 as viewed from the rear side.

The mobile terminal is provided with an apparatus case 1 as shown in FIG. 1 to FIG. 3. The apparatus case 1 consists of an upper case 2 and a lower case 3. The upper case 2 is provided with a displaying unit 4 and an input unit 5. The lower case 3 is provided with a reading device 6 and a battery cover 7.

As shown in FIG. 1 to FIG. 3, the apparatus case 1 is composed of a body part 1a and a grip part 1b, both parts constructed integrally. The body part 1a is formed approximately in a rectangular shape elongated toward the top of the drawing as viewed in FIG. 1 and the grip part 1b is also formed approximately in a rectangular shape elongated toward the bottom of the drawing as viewed in FIG. 1. The body part 1a includes the displaying unit 4 of the upper case 2 and the reading device 6 of the lower case 3 and the grip part 1b includes the input unit 5 of the upper case 2 and the battery cover 7 of the lower case 3.

More specifically, the apparatus case 1 is formed such that the length (width) of the grip part 1b in the direction perpendicular to the longer direction of the apparatus case 1 is shorter than the length (width) of the body part 1a in the direction perpendicular to the longer direction of the apparatus case 1, as shown in FIG. 1 to FIG. 3. Therefore, the whole apparatus case 1 is formed in the shape of a "Hagoita", which is a rectangular wooden paddle used to play "Hanetuki", Japanese traditional game like badminton. In other words, the apparatus case 1 is formed such that the surface area of the body part 1a is larger than the grip part 1b and the grip part 1b is formed in an easy gripping shape.

As shown in FIG. 1, the displaying unit 4 is provided with a flat-type displaying panel such as a liquid crystal displaying panel and an EL (Electro Luminescence) displaying panel. Information is displayed on the displaying panel in an electro-optical manner. More specifically, the displaying unit 4 is installed in the upper case 2 so as to face an opening part 2a provided in the upper case 2 corresponding to the body part 1a of the apparatus case 1.

With the arrangement of the displaying unit 4, the information displayed on the displaying unit 4 can be confirmed from the outside of the upper case 2 through the opening part 2a, as shown in FIG. 1. On the top side of the displaying unit 4 of the upper case 2, there are provided a speaker 8 and plural LEDs (Light Emitting Devices) 9.

As shown in FIG. 1, the input unit 5 is provided with various sorts of keys 5a such as ten keys, calculation keys, cursor keys, an OK key, and a power source key. The input unit 5 is disposed on the grip part 1b of the upper case 2. When the keys 5a of the input unit 5 are operated, information is entered to the mobile terminal. On the top side of the input unit 5, there is provided a center trigger key 5b. On the both side surfaces of the apparatus case 1, there are provided side trigger keys 5c, 5c, respectively, as shown in FIG. 2 and FIG. 3.

As shown in FIG. 2 and FIG. 3, the reading device 6 is installed on the bottom surface of the lower case 3 which corresponds to the body part 1a of the apparatus case 1. The reading device 6 is provided with a unit case 8, within which a reading unit and an imaging unit (both, not shown) are provided. The unit case 8 is detachably mounted on the bottom surface of the lower case 3 by means of plural screws 8a.

The reading unit is a scanner, which irradiates irradiation light such as laser light to an object to be read (not shown) and receives reflected light to read code information of the object. The imaging unit is a camera having image pickup elements and reads the object to obtain an image of the object.

As shown in FIG. 2 and FIG. 3, the code information read by the reading unit and the image of the object obtained by the imaging unit are displayed on the displaying unit 4. Meanwhile, the reading device 6 is configured so as to allow a user to operate the reading unit to read code information and the imaging unit to obtain an image of the object simultaneously, while watching the code information and the image of the object displayed on the displaying unit 4.

The unit case 8 is made of a square plate bent to form a gradual protruding part on the bottom surface of the lower case 3 along the longitudinal direction of the apparatus case 1 as shown in FIG. 2 and FIG. 3. The unit case 8 has a reading window 9a and an imaging window 9b, both facing the reading unit and the imaging unit, respectively. A light irradiation direction S1 of the reading unit and an image-pickup direction S2 of the imaging unit are set in the same direction.

The reading unit and the imaging unit are mounted in the unit case 8 such that the light irradiation direction S1 of the reading unit and the image-pickup direction S2 of the imaging unit keep a predetermined angle "θ" to the bottom surface of the apparatus case 1 as shown in FIG. 2. In other words, it is preferable to install the reading unit and the imaging unit on the unit case 8 with the light irradiation direction S1 and the image-pickup direction S2 to the bottom surface of the lower case 3 on the rear side of the displaying unit 4 falling within an angle range of 40 to 80 degrees, or preferably at the angle of 60 degrees.

The battery cover 7 is detachably fixed on the rear surface of the lower case 3 on the opposite side of the input unit 5 by means of a screw 7a as shown in FIG. 2 and FIG. 3. More specifically, the battery cover is formed in a half-cycle shape in cross section. When fixed on the rear surface of the lower case 3, the battery cover provides a space (not shown) between them (the cover and the case 3) for holding a battery therein. Further, the half-cycle shape of the battery cover serves to provide the easy gripping part 1b.

On the side surface of the apparatus case 1 a watertight cap 10 is fixed as shown in FIG. 2. The watertight cap 10 is constructed to shield a connector 12 such as USB connector provided on a circuit board 11 which is installed within the apparatus case 1 as shown in FIG. 4 to FIG. 6B. But the watertight cap 10 is also constructed to allow the user to open or shut the connector 12. On the side of the apparatus case 1 there is formed an installing recess 13 for receiving the watertight cap 10.

Figure 4:
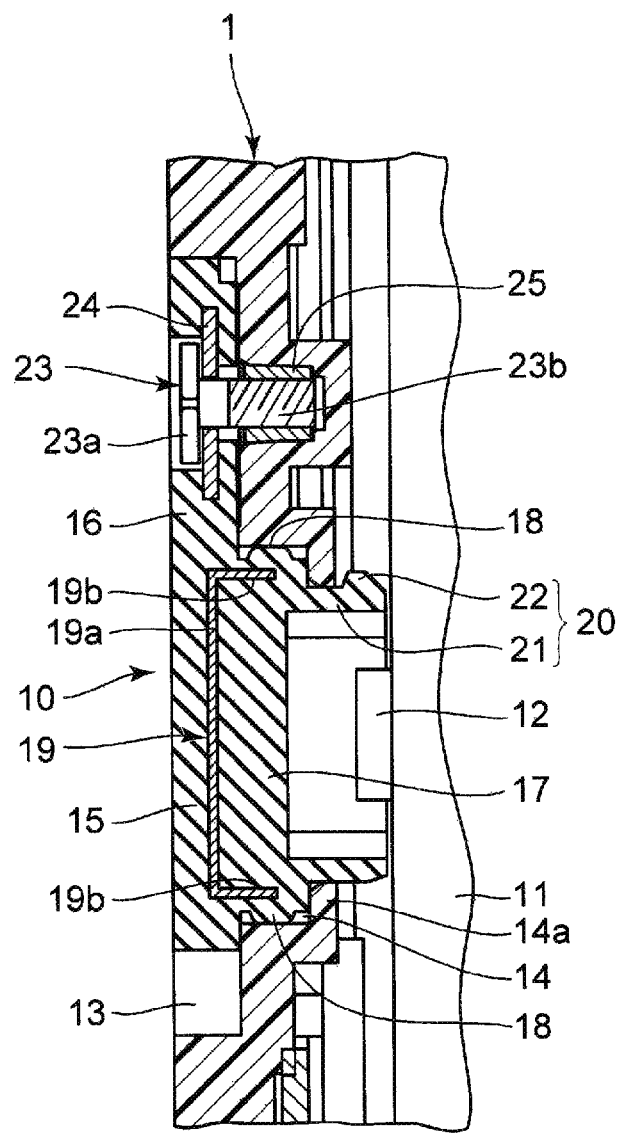
FIG. 4 is an enlarged cross sectional view of the mobile terminal taken on line A-A of FIG. 2.
Figure 5:
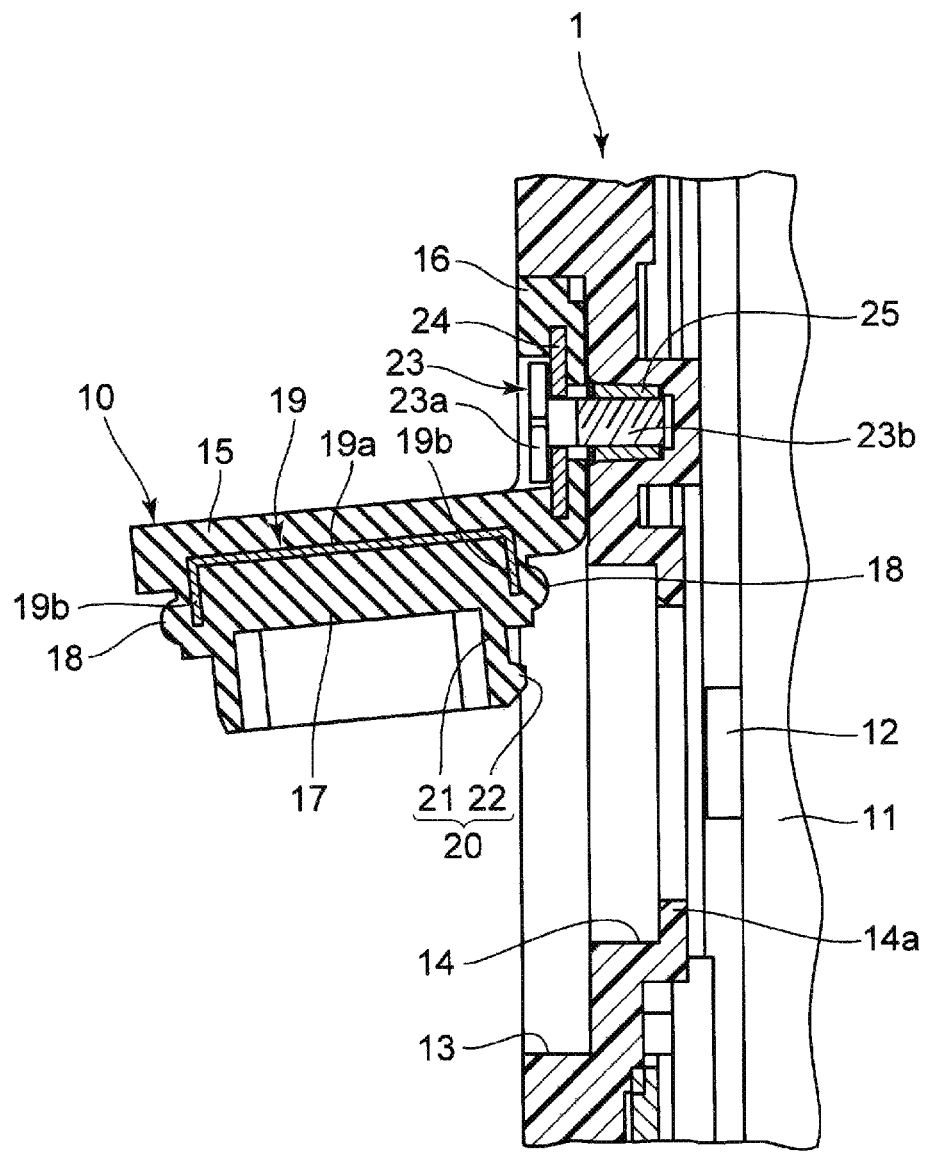
FIG. 5 is an enlarged cross sectional view showing the mobile terminal with a watertight cap pulled out from an apparatus case and an installing recess of the apparatus case exposed.

The installing recess 13 is formed in the shape of a rectangle elongated along the longitudinal direction of the apparatus case 1 as shown in FIG. 2, FIG. 4 and FIG. 5. In the installing recess 13, a through hole 14 is formed at a position facing the connector 12 of the circuit board 11, running through the apparatus case 1. The through hole 14 is almost a cubic room penetrating from the inside to outside of the apparatus case 1. At the edge of the surface defining the through hole 14 (the cubic room), there is provided a stopping part 14a having a step projecting to the inside of the through hole 14 (the cubic room).

As shown in FIG. 4 to FIG. 6B, the watertight cap 10 consists of a cap body 15 and an arm part 16 to be received in the installing recess 13 of the apparatus case 1. The cap body 15 and the arm part 16 are made of a synthetic resin having elastic force such as a silicon rubber and an elastomer, and are constructed integrally. The watertight cap 10 is made substantially the same in size as the installing recess 13 of the apparatus case 1, as shown in FIG. 2.

More particularly, as shown in FIG. 2 and FIG. 4 the watertight cap 10 is formed such that the length of the cap body 15 and the arm part 16 measured in the longitudinal direction of the apparatus case 1 is a little shorter than the installing recess 13 and the length of the cap body 15 and the arm part 16 measured in the direction perpendicular to the longitudinal direction of the apparatus case 1 is substantially the same as the installing recess 13.

When the watertight cap 10 (the cap body 15 and the arm part 16) having the above dimensions is set in the installing recess as shown in FIG. 2 and FIG. 4, a space is left between the walls of the installing recess 13 and the end of the cap body 15. The user is allowed to put his/her finger or a tool into the space to pull the cap body 15 out from the installing recess 13.

As shown in FIG. 4 to FIG. 6B, the cap body 15 is constructed to be received in and pulled out from the installing recess 13. The cap body 15 consists of an insertion part 17 to be inserted into the through hole 14 formed in the installing recess 13 of the apparatus case 1, a watertight projection 18 provided on the external peripheral surface of the insertion part 17 to be resiliently pressed against the surface defining the through hole 14, and a reinforce member 19 embedded in the cap body 15 and the insertion part 17 for preventing the insertion part 17 from being deformed inwards.

As shown in FIG. 4 to FIG. 6B, the insertion part 17 is made of the same synthetic resin having elastic force such as a silicon rubber and an elastomer as the cap body 15. The insertion part 17 projecting into the inside of the apparatus case 1 is constructed integrally with the cap body 15. The insertion part 17 is formed approximately in the shape of a cube and the outer shape of the insertion part 17 is a little smaller than the cubic room, that is, the through hole 14 provided in the apparatus case 1 and is larger than a portion defined by the stopping part 14a in the through hole 14.

In other words, the insertion part 17 is formed such that the length of the insertion part 17 to be inserted to the through hole 14 of the apparatus case 1 is approximately equivalent to the length of the surface defining the through hole 14 from one edge to the other edge (the stepped stopping part 14a), as shown in FIG. 4 to FIG. 6B. When the insertion part 17 having the above dimensions is inserted into the through hole 14 of the installing recess 13 with the cap body 15 of the watertight cap 10 set in the installing recess 13 of the apparatus case 1, the insertion part 17 is disposed in the through hole 14 with the end of the insertion part 17 abutting on the stepped stopping part 14a.

The watertight projection 18 is formed in the shape of a half-circle in cross section and is provided on the circumference surface of the insertion part 17 of the cap body 15 so as to surround the same surface, as shown in FIG. 4 to FIG. 6B. The watertight projection 18 is made of the same synthetic resin having elastic force such as a silicon rubber and an elastomer as the cap body 15 and the insertion part 17. The watertight projection 18 is constructed integrally with the insertion part 17.

As shown in FIG. 4 to FIG. 6B, when the insertion part 17 is inserted in the through hole 14 of the apparatus case 1, the whole circumference surface of the watertight projection 18 is resiliently pressed against the surface defining the through hole 14.

As shown in FIG. 4 and FIG. 5, the reinforce member 19 consists of a metal plate 19a and a metal frame 19b provided on the periphery of the metal plate 19a, these plate 19a and frame 19b being embedded in the cap body 15 and the insertion part 17. More specifically, the metal plate 19a of the reinforce member 19 is embedded in the cap body 15 and the metal frame 19b is embedded in a portion of the insertion part 17 close to the watertight projection 18. The metal frame 19b of the reinforce member 19 is embedded in the insertion part 17 such that the end of the metal frame 19b will come to the vicinity of the center of the watertight projection 18.

When the insertion part 17 of the cap body 15 is inserted into the through hole 14 and the circumference surface of the watertight projection 18 is resiliently pressed against the surface defining the through hole 14 as shown in FIG. 4 and FIG. 5, the reinforce member 19 serves to prevent the insertion part 17 from deforming toward its own center. Therefore, the reinforce member 19 is constructed so as to strongly press the watertight projection 18 against the portion or surface defining the through hole 14.

As shown in FIG. 4 to FIG. 6B, the insertion part 17 of the cap body 15 has a hook part 20 which can engage with the stepped stopping part 14a in the through hole 14 when the insertion part 17 is inserted into the through hoe 14 of the apparatus case 1. The hook part 20 is made of the same synthetic resin having elastic force such as a silicon rubber and an elastomer as the cap body 15 and the insertion part 17. The hook part 20 is constructed integrally with the insertion part 17.

As shown in FIG. 4 and FIG. 5, the hook part 20 consists of an elastic projecting part 21 of a frame shape formed on the insertion part 17 of the cap body 15 and an engaging part 22 provided on the periphery of the elastic projecting part 21. When the insertion part 17 of the cap body 15 is inserted into the through hole 14 of the apparatus case 1, the elastic projecting part 21 of the insertion part 17 passes through the vicinity of the stepped stopping part 14a in the through hole 14 and the engaging part 22 on the elastic projecting part 21 engages with the stepped stopping part 14a in the through hole 14, as shown in FIG. 4.

More specifically, when the insertion part 17 is inserted in the through hole 14 of the apparatus case 1 as shown in FIG. 4, the elastic projecting part 21 extends from the bottom portion of the insertion part 17 into the apparatus case 1 without receiving any force pressing to the inside, wherein the bottom portion of the insertion part 17 falls within an area defined by the metal frame 196b of the reinforce member 19. Therefore, the elastic projecting part 21 of the insertion part 17 is configured such that the elastic projecting part 21 will be elastically deformed insides in the apparatus case 1 without receiving any force from the metal frame 19b of the reinforce member 19, when the insertion part 17 is inserted in the through hole 14 of the apparatus case 1.

The external shape of the elastic projecting part 21 is made smaller than the external shape of the insertion part 17 of the cap body 15 and also smaller than the internal shape of the metal frame 19b of the reinforce member 19. Further, the external shape of the elastic projecting part 21 is made approximately equivalent to a region surrounded by the stepped stopping part 14a in the through hole 14, as shown in FIG. 4 and FIG. 5. The length of the elastic projecting part 21 extending into the apparatus case 1 is larger than the thickness of the stepped stopping part 14a in the through hole 14.

When the insertion part 17 of the cap body 15 is inserted into the through hole 14 formed in the installing recess 13 of the apparatus case 1 and the end of the insertion part 17 abuts on the stepped stopping part 14a in the through hole 14, the peripheral of the elastic projecting part 21 projects into the inside of the apparatus case 1 through the stepped stopping part 14a in the through hole 14, and a space or room secured by the frame of the elastic projecting part 21 projected into the inside of the apparatus case 1 is used for receiving the end of the connector 12 of the circuit board 11.

As shown in FIG. 4 and FIG. 5, the engaging part 22 is provided on the periphery of the elastic projecting part 21. When the insertion part 17 of the cap body 15 is inserted into the through hole 14 formed in the installing recess 13 of the apparatus case 1, and the elastic projecting part 21 of the insertion part 17 passes through the vicinity of the stepped stopping part 14a in the through hole 14, the engaging part 22 makes the elastic projecting part 21 elastically deform toward the inside.

When the elastic projecting part 21 of the insertion part 17 passes through the vicinity of the stepped stopping part 14a in the through hole 14 to project into the inside of the apparatus case 1, the engaging part 22 of the insertion part 17 engages with the peripheral of the stepped stopping part 14a in the through hole 14, as shown in FIG. 4 and FIG. 5. The engagement of the engaging part 22 with the stepped stopping part 14a prevents the insertion part 17 of the cap body 15 from easily slipping out from the through hole 14.

Meanwhile, as shown in FIG. 4 to FIG. 6B, the arm part 16 extends from the cap body 15 and is constructed integrally with the cap body 15. The extending part of the arm part 16 is fixed to the installing recess 13 of the apparatus case 1 by means of a screw 23.

The screw 23 has a head 23a and a screw part 23b. The screw part 23b is screwed with a screwed pipe 25 embedded in the apparatus case 1 through a washer 24 embedded in the arm 16, as shown in FIG. 4 and FIG. 5. When the screw part 23b is screwed with the screwed pipe 25, the head 23a fixes the arm part 16 firmly to the installing recess 13 through the washer 24.

The arm part 16 is made of the same synthetic resin having elastic force such as a silicon rubber and an elastomer as the cap body 15, and is constructed integrally with the cap body 15 as shown in FIG. 4 and FIG. 5. Therefore, the portion of the arm part 16 between the end which is fixed with the screw 23 and the cap body 15 can be bent. Using the arm part 16 which can be bent or deformed with the screw 23 as a fulcrum, the cap body 15 can be set in or pulled out from the installing recess 13 of the apparatus case 1, whereby the through hole 14 is closed or opened by the cap body 15.

As shown in FIG. 4 and FIG. 5, when the arm part 16 is bent or deformed and the cap body 15 is set in the installing recess 13 of the apparatus case 1, the insertion part 17 is inserted into the through hole 14 of the installing recess 13, whereby the through hole 14 is closed by the insertion part 17 and the engaging part 22 of the elastic projecting part 21 engages with the stepped stopping part 14a in the through hole 14.

When the arm part 16 is bent or deformed with the screw 23 as a fulcrum, and pulled out form the installing recess 13 of the apparatus case 1, the engagement of the engaging part 22 of the hook part 20 with the stepped stopping part 14a in the through hole 14 is released, allowing the insertion part 17 to be pulled out from the through hole 14 provided in the installing recess 13 of the apparatus case 1 as shown in FIG. 4 and FIG. 5, whereby the through hole 14 is made open and the connector 12 in the apparatus case 1 is exposed.

Figure 6A:
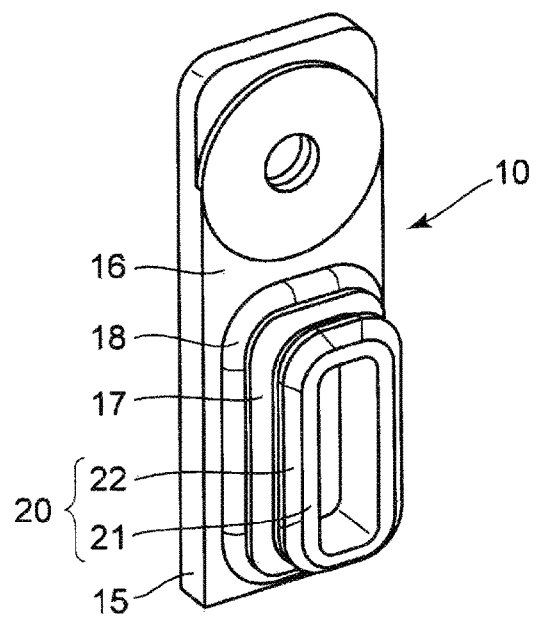
FIG. 6A is an enlarged perspective view showing the watertight cap as viewed from the inside of the apparatus case.
Figure 6B:
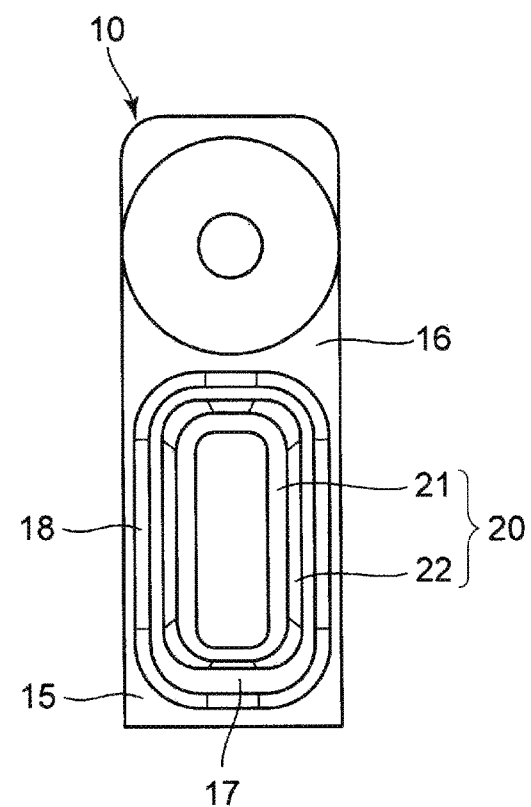
FIG. 6B is an enlarged top view showing the watertight cap.

As shown in FIG. 6A and FIG. 6B, the length of a portion of the engaging part 22 projecting from the external periphery of the elastic projecting part 21 is made gradually shorter as a distance of the portion from the screw 23 or the fulcrum of the arm part 16 increases. In other words, the engaging part 22 projects long at the portion of the engaging part 22 close to the screw 23. The projecting length of the engaging part 22 is made shorter as the portion goes far away from the screw 23 and finally the engaging part 22 is made in a cut-out shape at the portion of the engaging part 22 which is farthest from the screw 23.

When the cap body 15 is turned with the arm part 16 centered to bring the elastic projecting part 21 to the inside of the stepped stopping part 14a in the through hole 14 as shown in FIG. 4 and FIG. 5, the engaging part 22 of the elastic projecting part 21 successively engages with the stepped stopping part 14a in the through hole 14 in the order of long projecting portion, whereby easy engagement between the engaging part 22 and the stepped stopping part 14a is allowed.

As shown in FIG. 4 and FIG. 5, the watertight cap 10 consists of the cap body 15, the arm part 16, the insertion part 17, the watertight projection 18, and the hook part 20, all of which are made of the synthetic resin having elastic force such as a silicon rubber and an elastomer and are constructed integrally. Further, the reinforce member 19 is embedded in the cap body 15 and the insertion part 17 by using an insert molding method.

A function of the mobile terminal provided with the apparatus case 1 described above will be described.

When using the mobile terminal, an operator holds the grip part 1b of the apparatus case 1 with his/her hand with the body part 1a facing the operator. When the mobile terminal is held in this manner, since the displaying unit 4 and the input unit 5 of the upper case 2 face the operator, the operator can easily operate the various keys 5a of the input unit 5 to enter commodity information and stock information. The entered information is displayed on the displaying unit 4.

When using the reading device 6 to read code information of an object such as a label put on the commodity or goods and its image, the operator turns the reading window 9a and the imaging window 9b of the unit case 8 to the object and operates either of the center trigger key 5b on the top side of the input unit 5 and the side trigger keys 5c, 5c on the side surfaces of the apparatus case 1. Then, the reading unit of the reading device 6 reads the code information of the object and at the same time the imaging unit of the reading device 6 obtains an image of the object.

The code information and the image of the object obtained by the reading device 6 are displayed on the displaying unit 4. While watching the code information and the image of the object displayed on the displaying unit 4, the operator operates the OK key 5a of the input unit 5 to store the code information and the image of the object.

When the mobile terminal is connected to other apparatus (not shown), the cap body 15 of the watertight cap 10 provided on the side surface of the apparatus case 1 is opened to expose the through hole 14 of the apparatus case 1. A connecting cable (not shown) of the other apparatus is connected to the connector 12 in the apparatus case 1 through the through hole 14 of the apparatus case 1.

The arm part 16 fixed to the apparatus case 1 with the screw 23 is bent or deformed with the screw 23 as a fulcrum to turn the cap body 15 towards the outside of the apparatus case 1. Then, the engaging part 22 of the hook part 20 makes the elastic projecting part 21 of the hook part 20 elastically deform inwards to disengage itself from the stepped stopping part 14a in the through hole 14, whereby the hook part 20 is released from the stepped stopping part 14a and allowed to be pulled out from the through hole 14 provided in the installing recess 13 of the apparatus case 1.

When the cap body 15 is pulled out form the installing recess 13 of the apparatus case 1, since a portion of the cap body 15 travels a longer turning way as the distance of the portion of the cap body 15 from the screw 23 increases, the engagement between the engaging part 22 of the hook part 20 and the stepped stopping part 14a in the through hole 14 is successively released from the portion of the cap body 15 being far away from the screw 23.

The length of a portion of the engaging part 22 of the hook part 20 projecting from the external peripheral of the elastic projecting part 21 is made gradually shorter as the distance of the portion of the engaging part 22 from the screw 23 serving as the fulcrum of the arm part 16 increases. Since the engaging part 22 of the hook part 20 is successively released from the stepped stopping part 14a in the through hole 14, starting from the cut-out portion of the engaging part 22 and then in the order of a short projecting length of the engaging part 22, the engagement of the engaging part 22 with the stepped stopping part 14a in the through hole 14 can be released easily and smoothly.

In other words, when the engagement between the engaging part 22 of the hook part 20 and the stepped stopping part 14a in the through hole 14 is released at the cut-out portion of the engaging part 22, the engaging part 22 is released from such engagement without making the elastic projecting part 21 substantially deform insides. When the portion of the engaging part 22 which gradually increases the projecting length is released from the stepped stopping part 14a in the through hole 14, the elastic projecting part 21 is gradually bent largely towards the inside, releasing the engaging part 22 from the stepped stopping part 14a easily and smoothly.

When the hook part 20 is released from the stepped stopping part 14a in the through hole 14 and is pulled out from the apparatus case 1, the insertion part 17 of the cap body 15 is drawn out together with the watertight projection 18 from the through hole 14 of the apparatus case 1. Then, the through hole 14 of the apparatus case 1 is made open, and the connector 12 provided in the apparatus case 1 is exposed through the through hole 14.

Meanwhile, when the through hole 14 of the installing recess 13 is closed with the watertight cap 10, the arm part 16 is bent with the screw 23 fixing the arm part 16 to the apparatus case 1 as a fulcrum to make the cap body 15 turn to the apparatus case 1. Then, the elastic projecting part 21 of the hook part 20 is pressed into the inside of the apparatus case 1 through the stepped stopping part 14a in the through hole 14 of the apparatus case 1 and the insertion part 17 of the cap body 15 is inserted into the through hole 14.

The watertight projection 18 provided on the outer peripheral surface of the insertion part 17 is resiliently pressed against the surface defining the through hole 14 and the peripheral of the insertion part 17 staying inside the apparatus case 1 resiliently contacts with the stepped stopping part 14a in the through hole 14. Under the condition, the cap body 15 is set in the installing recess 13 of the apparatus case 1.

In other words, when the watertight projection 18 of the insertion part 17 resiliently contacts with the surface defining the through hole 14, the reinforce member 19 embedded in the cap body 15 and the insertion part 17 restricts the insertion part 17 no so as to deform towards its inside. Therefore, when the watertight projection 18 is inserted into the through hole 14 together with the insertion part 17, the watertight projection 18 is firmly pressed against the surface defining the through hole 14 by the reinforce member 19.

When the cap body 15 is turned to the apparatus case 1 to close the installing recess 13, since a portion of the cap body 15 travels a longer turning way as the distance of the portion of the cap body 15 from the screw 23 increases, the engagement of the engaging part 22 of the hook part 20 with the stepped stopping part 14a in the through hole 14 starts with the portion of the engaging part 22 which is more close to the screw 23 serving as the fulcrum of the arm part 16.

The length of the portion of the engaging part 22 of the hook part 20 projecting from the external peripheral of the elastic projecting part 21 is made gradually shorter as the distance of the portion of the engaging part 22 from the screw 23 serving as the fulcrum of the arm part 16 increases. Therefore, since the engagement between the engaging part 22 of the hook part 20 and the stepped stopping part 14a in the through hole 14 is successively made in the order of a long portion of the engaging part 22 projecting from the external peripheral of the elastic projecting part 21, the engagement of the engaging part 22 with the stepped stopping part 14a in the through hole 14 can be made easily and smoothly.

In other words, when the long projecting portion of the engaging part 22 engages with the stepped stopping part 14a in the through hole 14, the hook part 20 makes the elastic projecting part 21 largely deform or bend inwards to bring the engaging part 22 to engage with the stepped stopping part 14a in the through hole 14. Further, when the portion of the engaging part 22 which projects shorter engages with the stepped stopping part 14a in the through hole 14, the hook part 20 makes inward deformation of the elastic projecting part 21 gradually reduce, thereby making the engaging part 22 engage with the stepped stopping part 14a in the through hole 14 easily and smoothly.

As described above, the elastic projecting part 21 of the hook part 20 projects into the apparatus case 1 and meanwhile, the end of the connector 12 in the apparatus case 1 is inserted within a room secured in the apparatus case 1 by the frame of the elastic projecting part 21 projected in the apparatus case 1. Under the state, the insertion part 17 of the cap body 15 firmly closes the through hole 14 and the cap body 15 and the arm part 16 are set in the installing recess 13 of the apparatus case 1.

The watertight projection 18 provided on the external peripheral surface of the insertion part 17 is resiliently pressed against the surface defining the through hole 14 by the reinforce member 19, whereby the watertight of the through hole 14 is secured. Since the end of the connector 12 in the apparatus case 1 is inserted into the room secured by the frame of the elastic projecting part 21, the connector 12 is protected firmly and in a good condition by the watertight cap 10, even if the watertight cap 10 receives an external shock.

As described above, the watertight cap 10 of the mobile terminal has the cap body 15 to be disposed in the installing recess 13 of the apparatus case 1, the insertion part 17 provided on the cap body 15 to be resiliently inserted into the through hole 14 formed in the installing recess 13, the watertight projection 18 provided on the whole external peripheral surface of the insertion part 17 to be resiliently pressed against the surface defining the through hole 14 in the apparatus case 1, the reinforce member 19 embedded in the cap body 15 and the insertion part 17 for preventing the insertion part 17 from deforming inwards, and the hook part 20 provided on the insertion part 17 of the cap body 15 so as to project into the apparatus case 1, which part 20 engages with the stepped stopping part 14a in the through hole 14, when the insertion part 17 is inserted in the through hole 14 of the apparatus case 1.

Therefore, the watertight cap 10 of the apparatus case 1 secures enhanced watertight of the apparatus case 1 and can prevent the cap body 15 from slipping out from the apparatus case 1 accidentally.

In the watertight cap 10 of the mobile terminal, since the reinforce member 19 embedded in the cap body 15 and the insertion part 17 prevents the insertion part 17 from deforming towards the inside, the reinforce member 19 resiliently urges the watertight projection 18 provided on the whole circumference surface of the insertion part 17 against the surface defining the through hole 14, when the insertion part 17 is inserted in the through hole 14 of the apparatus case 1, whereby the watertight cap 10 can secure watertight of the through hole 17 of the apparatus case 1.

Since the watertight projection 18 provided on the whole circumference surface of the insertion part 17, when the insertion part 17 is inserted in the through hole 14 of the apparatus case 1, the reinforce member 19 resiliently presses the watertight projection 18 towards the whole surface defining the through hole 14 of the apparatus case 1, whereby the watertight projection 18 can secure watertight of the through hole 17 of the apparatus case 1.

The watertight cap 10 is formed on the insertion part 17 of the cap body 15 and is provided with the hook part 20 which engages with the stepped stopping part 14a in the through hole 14, when the insertion part 17 is inserted in the through hole 14 of the apparatus case 1. Therefore, when the insertion part 17 is inserted in the through hole 14 of the apparatus case 1, the hook part 20 can engage with the edge part of the through hole 14, thereby preventing the insertion part 17 from slipping out from the through hole 14 of the apparatus case 1 accidentally.

The reinforce member 19 has the flat metal plate 19a embedded in the cap body 15 and the metal frame 19b provided on the periphery of the metal plate 19a and embedded along the whole circumference of the watertight projection 18 in the insertion part 17. Therefore, the reinforce member 19 can firmly prevent the cap body 15 and the insertion part 17 from deforming.

The end of metal frame 19b embedded on the side of the apparatus case 1 substantially corresponds to the center of the watertight projection 18 to prevent the insertion part 17 from deforming towards the inside, whereby the watertight projection 18 can be firmly pressed against the surface defining the through hole 14.

The hook part 20 is formed on the portion of the insertion part 17 which falls within an area defined by the metal frame 19b of the reinforce member 19 and has the elastic projecting part 21 of a frame shape, projecting into the apparatus case 1 through the stepped stopping part 14a in the through hole 14, and the engaging part 22 provided on the periphery of the elastic projecting part 21. The engaging part 22 engages with the stepped stopping part 14a in the through hole 14, when the elastic projecting part 21 is inserted to the apparatus case 1 through the stepped stopping part 14a in the through hole 14. The hook part 20 having the above structure secures the firm engagement between the engaging part 22 and the stepped stopping part 14a in the through hole 14.

Since the elastic projecting part 21 of the hook part 20 is brought into the inside of the apparatus case 1, when the insertion part 17 is inserted in the through hole 14 of the apparatus case 1, the engaging part 22 can be tightly engaged with the stepped stopping part 14a in the through hole 14. Therefore, the tight engagement of the engaging part 22 of the hook part 20 with the stepped stopping part 14a in the through hole 14 will prevent the insertion part 17 from slipping off easily from the through hole 14 of the apparatus case 1.

In other words, the hook part 20 is provided with the engaging part 22 formed on the external periphery surface of the elastic projecting part 21 to be held in the apparatus case 1. When passing through the through hole 14 into the apparatus case 1, the engaging part 22 of the hook part 20 makes the elastic projecting part 21 elastically deform inward. Therefore, the hook part 20 makes the periphery of the elastic projecting part 21 project into the inside of the apparatus case 1, thereby firmly securing the engagement between the engaging part 22 and the stepped stopping part 14a in the through hole 14.

The elastic projecting part 21 is formed on the portion of the insertion part 17 which falls within the area defined by the frame shape of the metal frame 19b of the reinforce member 19. When passing through the through hole 14 into the apparatus case 1, the engaging part 22 of the hook part 20 can make the elastic projecting part 21 elastically deform inward without receiving an effect of the metal frame 19b of the reinforce member 19, whereby the engagement between the engaging part 22 and the stepped stopping part 14a in the through hole 14 is firmly secured.

In the watertight cap 10, the cap body 15 has the arm part 16 which flexibly extends from one side of the cap body 15 and is fixed to the apparatus case 1. The arm part 16 is deformed, allowing the cap body 15 to perform opening/closing operation, whereby the arm part 16 is bent, allowing the cap body 15 to perform a turning movement to open and/or close the through hole 14 of the apparatus case 1 in a simple manner.

In other words, since the arm part 16 extending from the cap body 15 is fixed at its one end to the apparatus case 1 with the screw 23 and can be easily bent or deformed with the screw 23 as a fulcrum, the cap body 15 turns when the arm part 16 is bent or deformed, whereby the cap body 15 can firmly open and/or close the through hole 14 of the apparatus case 1.

Since the length of a portion of the engaging part 22 projecting from the external peripheral of the elastic projecting part 21 is made shorter as the distance of the portion from the position where the arm part 16 is fixed by the screw 23 increases, a portion of the engaging part 22 can be engaged with the stepped stopping part 14a in the through hole 14 in order from a short distance of the portion from the screw 23 or the fulcrum of the arm part 16 to a long distance of the position, even though a portion of the cap body 15 travels a loner turning way as the distance of the portion of the cap body 15 from the screw 23, that is, the position where the arm part is fixed increases.

In other words, since the length of a portion of the engaging part 22 projecting from the external peripheral of the elastic projecting part 21 is made shorter as the distance of the portion from the fulcrum of the arm part 16 or the screw 23 increases, the hook part 20 can make a portion of the engaging part 22 engage with the stepped stopping part 14a in the through hole 14 in order from the long projecting portion of the engaging part 22 to the short projecting portion of the engaging part 22, whereby the engagement of the engaging part 22 with the stepped stopping part 14a in the through hole 14 can be made easily and smoothly.

In this case, when the long projecting portion of the engaging part 22 engages with the stepped stopping part 14a in the through hole 14, the hook part 20 makes the elastic projecting part 21 largely deform or bend inwards. Further, when the short projecting portion of the engaging part 22 engages with the stepped stopping part 14a in the through hole 14, the hook part 20 gradually reduces deformation of the elastic projecting part 21 inwards, thereby making the engaging part 22 engage with the stepped stopping part 14a in the through hole 14 easily and smoothly.

The watertight cap 10 has the cap body 15, the arm part 16, the insertion part 17, the watertight projection 18, and the hook part 20, all of which are made of the synthetic resin having elastic force such as a silicon rubber and an elastomer, and are constructed integrally. These elements are constructed easily and simply and at low costs. Since it is possible to embed the reinforce member 19 in the cap body 15 and the insertion part 17 using the insert molding technique, the production cost of the watertight cap 10 can be reduced.

In the above description, the embodiment of the invention is described, in which the connector 12 such as an USB connector is provided in the apparatus case 1 to be inserted into the through hole 14, but the invention is not always restricted to the connector 12 but, for example, jacks for an ear phone and a power source jack may be employed in place of the connector 12.

In the above embodiment the invention is applied to the mobile terminal, but, for example, the invention can be applied to other electronic devices such as a cellular phone.

Although specific embodiments of the invention have been described in the above detailed description, it will be understood that the invention is not limited to the particular embodiments described herein, but modifications and rearrangements may be made to the disclosed embodiments while remaining within the scope of the invention as defined by the following claims. It is intended to include all such modifications and rearrangements in the following claims and their equivalents.

What is claimed is:

1. An electronic apparatus having a case with an installing recess provided therein, the installing recess being for receiving a watertight cap, wherein the watertight cap comprises:
    a cap body which is removably disposed in the installing recess of the case;
    an insertion part having elastic force provided on the cap body, which is inserted in a through hole when the cap body is received in the installing recess of the case, the through hole being provided in the installing recess and penetrating from inside to outside of the case;
    a watertight projection provided on a whole external peripheral surface of the insertion part, said watertight projection being pressed against a part of a surface defining the through hole in the case, when the insertion part is inserted in the through hole;
    a reinforcing member embedded in the cap body and the insertion part so as to prevent the insertion part from deforming inwards; and
    a hook part provided on the insertion part, said hook part protruding inside the case to engage with an edge of the surface defining the through hole, when the insertion part is inserted in the through hole of the case.

2. The electronic apparatus according to claim 1, wherein the installing recess is provided on a side surface of the case.

3. The electronic apparatus according to claim 1, wherein the watertight cap is configured to close and open the installing recess, thereby covering and exposing a connector on a circuit board provided in the case.

4. The electronic apparatus according to claim 1, wherein the watertight cap is configured to close and open the installing recess, thereby covering and exposing an ear phone jack.

5. The electronic apparatus according to claim 1, wherein the watertight cap is configured to close and open the installing recess, thereby covering and exposing a power source jack.

6. The electronic apparatus according to claim 1, wherein the installing recess is substantially equivalent in size to the watertight cap.

7. The electronic apparatus according to claim 1, wherein the through hole forms a cubic space, and a stopping part with a step is provided on an edge of the surface defining the through hole in the case, the step of the stopping part projecting inside the through hole.

8. The electronic apparatus according to claim 7, wherein the insertion part has a cube shape, and an external shape of the insertion part is smaller than a space produced by the surface defining the through hole, and larger than an internal distance defined by the stopping part projecting inside the through hole.

9. The electronic apparatus according to claim 7, wherein a length of the insertion part to be inserted in the case is substantially equivalent to a distance between the stopping part on one edge of the surface defining the through hole and another edge of the surface defining the through hole.

* * * * *